United States Patent

Yamada et al.

Patent Number: 5,889,446
Date of Patent: Mar. 30, 1999

[54] SURFACE ACOUSTIC WAVE DEVICE WITH A RESISTOR THIN FILM TO REMOVE PYROELECTRIC EFFECT CHARGES

[75] Inventors: Yoshihiro Yamada; Yasushi Yamamoto, both of Tokyo, Japan

[73] Assignee: NEC Corporation, Tokyo, Japan

[21] Appl. No.: 782,999

[22] Filed: Jan. 14, 1997

[30] Foreign Application Priority Data

Jan. 19, 1996 [JP] Japan .................. 8-025777

[51] Int. Cl.$^6$ .............................. H03H 9/25; H03H 9/64
[52] U.S. Cl. ................. 333/193; 310/313 R; 310/313 B; 333/194
[58] Field of Search .................. 333/193–196; 310/313 R, 313 B, 313 C, 313 D

[56] References Cited

U.S. PATENT DOCUMENTS

| | | | |
|---|---|---|---|
| 4,448,805 | 5/1984 | Lewis | 310/313 B X |
| 5,446,330 | 8/1995 | Eda et al. | 310/313 R |

FOREIGN PATENT DOCUMENTS

| | | | |
|---|---|---|---|
| 54-51390 | 4/1979 | Japan | 333/193 |
| S56-138317 | 10/1981 | Japan . | |
| 56-149109 | 11/1981 | Japan . | |
| 56-149813 A | 11/1981 | Japan | 333/193 |
| S56-149110 | 11/1981 | Japan . | |
| S57-501759 | 5/1982 | Japan . | |
| S63-65320 | 10/1986 | Japan . | |
| H1-106611 | 4/1989 | Japan . | |
| H1-252016 | 10/1989 | Japan . | |
| 4-150512 A | 5/1992 | Japan | 310/313 B |
| 4-258008 | 9/1992 | Japan | 333/193 |
| 5-183370 A | 7/1993 | Japan | 333/193 |
| 6-164295 | 10/1994 | Japan . | |

*Primary Examiner*—Robert Pascal
*Assistant Examiner*—Barbara Summons
*Attorney, Agent, or Firm*—Scully, Scott, Murphy and Presser

[57] ABSTRACT

A surface acoustic wave device includes a piezoelectric substrate, an interdigital electrode pattern, and a resistor thin film. The piezoelectric substrate has a piezoelectric effect. The interdigital electrode pattern is made of a conductive thin film and formed on the piezoelectric substrate to perform conversion between an electrical signal and a surface acoustic wave. The resistor thin film is formed on the piezoelectric substrate to electrically connect the piezoelectric substrate to the interdigital electrode pattern. The resistor thin film serves to remove charges from a surface of the piezoelectric substrate due to a pyroelectric effect to the interdigital electrode pattern.

3 Claims, 2 Drawing Sheets

SURFACE ACOUSTIC WAVE DEVICE WITH A RESISTOR THIN FILM TO REMOVE PYROELECTRIC EFFECT CHARGES

BACKGROUND OF THE INVENTION

The present invention relates to a surface acoustic wave (SAW) device and, more particularly to an SAW device in which noise caused by the pyroelectric effect of the piezoelectric substrate is suppressed.

In general, an SAW device such as an SAW filter has appropriately weighted interdigital transducers (IDTS) as input/output transducers on the surface of the piezoelectric substrate to perform conversion between an electrical signal and an SAW. In the conventional SAW device, an IDT pattern is merely formed of a conductive thin film on the piezoelectric substrate.

FIG. 3A shows an example of a conventional SAW device, and FIG. 3B shows the device of FIG. 3A along the line 3B—3B. As shown in FIGS. 3A and 3B, in the conventional SAW device, merely the pattern of IDTs 22 and 22' is directly formed of a conductive thin film on a piezoelectric substrate 21.

In the conventional SAW device shown in FIGS. 3A and 3B, when the ambient temperature changes, the surface of the piezoelectric substrate 21 is charged due to the pyroelectric effect of the piezoelectric substrate 21. When an electric field formed by the charges becomes equal to or more than the dielectric breakdown of the surrounding atmosphere of the piezoelectric substrate 21, the charges on the piezoelectric substrate 21 are discharged to the IDTs 22 and 22'.

If the charges are discharged to the ground-side IDT 22', the problem of noise does not occur in the SAW device. However, if the charges are discharged to the hot-side IDT 22, noise occurs in the SAW device.

In the latter case, the charges on the surface of the piezoelectric substrate 21 are not discharged unless they become equal to or more than the dielectric breakdown of the surrounding atmosphere of the piezoelectric substrate 21. Thus, the amount of charges removed at once becomes large to increase the noise level.

In particular, in an SAW device that uses lithium tantalate ($LiTaO_3$) or lithium niobate ($LiNbO_3$) as the material of the piezoelectric substrate 21, the piezoelectric substrate 21 has a strong pyroelectric effect, and the above drawback is remarkable.

SUMMARY OF THE INVENTION

It is an object of the present invention to provide a surface acoustic wave device in which generation of noise due to the pyroelectric effect of the piezoelectric substrate is suppressed.

In order to achieve the above object, according to the present invention, there is provided a surface acoustic wave device comprising a piezoelectric substrate having a piezoelectric effect, an interdigital electrode pattern made of a conductive thin film and formed on the piezoelectric substrate to perform conversion between an electrical signal and a surface acoustic wave, and a resistor thin film formed on the piezoelectric substrate to electrically connect the piezoelectric substrate to the interdigital electrode pattern, the resistor thin film serving to remove charges from a surface of the piezoelectric substrate due to a pyroelectric effect to the interdigital electrode pattern.

DESCRIPTION OF THE PREFERRED EMBODIMENTS

The present invention will be described in detail with reference to the accompanying drawings.

Figure 1A:
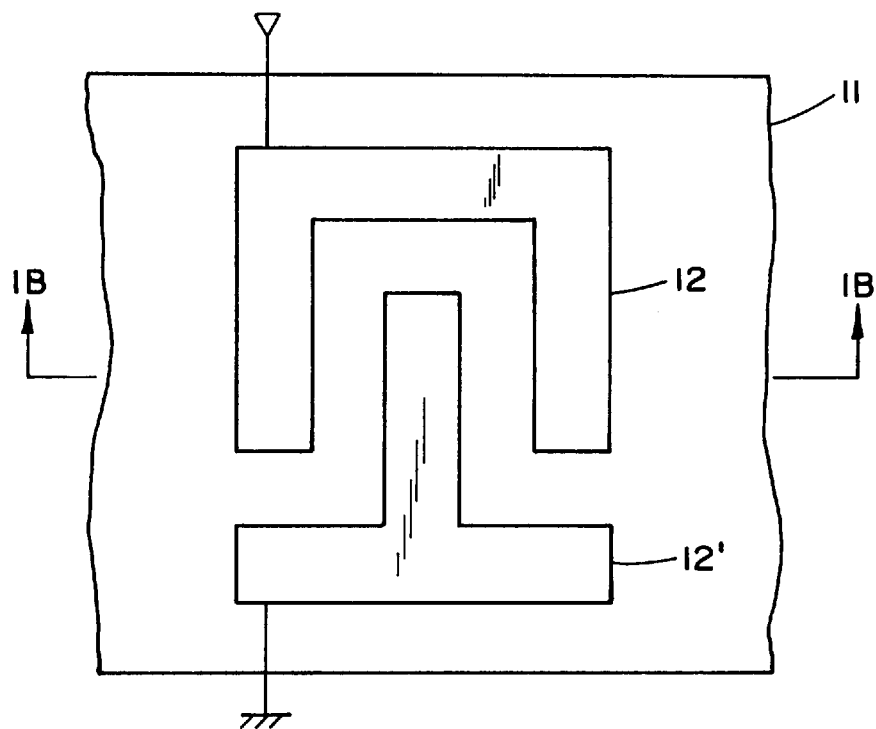
FIG. 1A is a plan view showing a surface acoustic wave device according to the first embodiment of the present invention.
Figure 1B:
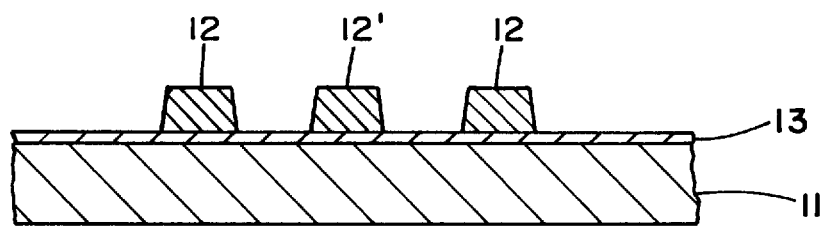
FIG. 1B is a sectional view taken along the line 1B—1B of FIG. 1A.

FIG. 1A shows a surface acoustic wave (SAW) device according to the first embodiment of the present invention, and FIG. 1B shows the surface acoustic wave device of FIG. 1A along the line 1B—1B.

In the SAW device shown in FIGS. 1A and 1B, a resistor thin film 13 having a low resistance is formed on the entire surface of a piezoelectric substrate 11, and a pattern of IDTs 12 and 12' made of a conductive film, e.g., aluminum, is formed on the resistor thin film 13 to have a predetermined shape. Discharge can be facilitated when the resistance of the resistor thin film is minimized within the range which does not adversely affect the electrical performance of the SAW filter. As the material of the piezoelectric substrate 11, e.g., lithium tantalate ($LiTaO_3$) or lithium niobate ($LiNbO_3$) is used. As the resistor thin film 13, e.g., a silicon (Si) thin film formed by sputtering or vapor deposition is used.

The operation of the SAW device having the above arrangement will be described. When the SAW device functions as an input transducer, upon application of an RF electrical signal across the IDTs 12 and 12', an RF electric field is generated, and an SAW is excited by the piezoelectric effect of the piezoelectric substrate 11. When the SAW device functions as an output transducer, upon reception of an SAW, an RF electric field is generated by the piezoelectric reaction to output an electrical signal between the IDTs 12 and 12'.

The low-resistance resistor thin film 13 interposed between the IDTs 12 and 12' and the piezoelectric substrate 11 constitutes a discharge line for the charges of the piezoelectric substrate 11. Therefore, the charges generated on the surface of the piezoelectric substrate 11 upon a change in ambient temperature due to the pyroelectric effect of the piezoelectric substrate 11 are removed to the IDTs 12 and 12' through the resistor thin film 13 as soon as they are generated. In other words, the charges are not accumulated on the surface of the piezoelectric substrate 11.

Even if the charges generated on the surface of the piezoelectric substrate 11 due to the pyroelectric effect are removed to the ground-side IDT 12', no problem occurs in the SAW device. On the contrary, if the charges are removed to the hot-side IDT 12, they appear as noise at the input/output terminals of the SAW device.

However, since the charges generated on the surface of the piezoelectric substrate 11 are removed to the IDTs 12 and 12' as soon as they are generated, the amount of removed charges is very small. As a result, the level of noise appearing at the input/output terminals of the SAW device can be minimized.

Figure 2:
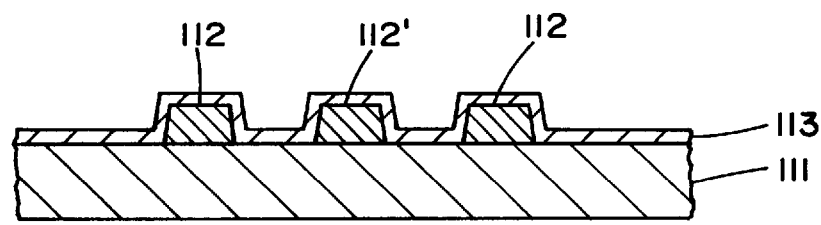
FIG. 2 is a sectional view showing a surface acoustic wave device according to the second embodiment of the present invention.
Figure 3A:
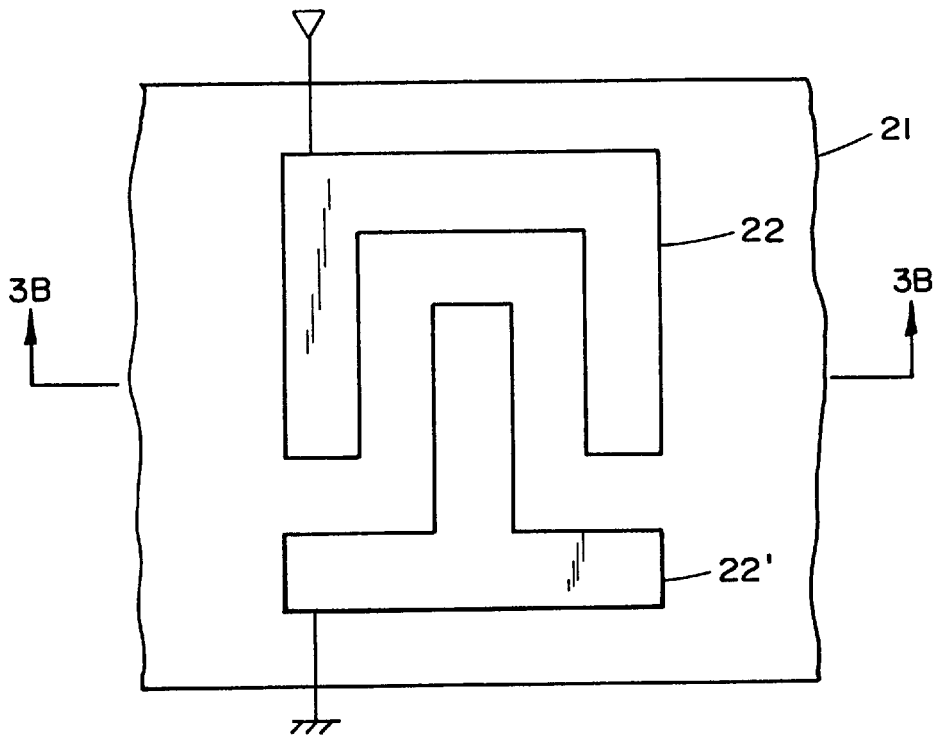
FIG. 3A is a plan view of a conventional surface acoustic wave device.
Figure 3B:
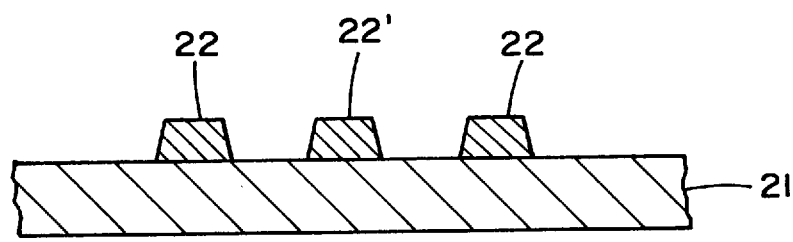
FIG. 3B is a sectional view taken along the line 3B—3B of FIG. 3A.

FIG. 2 shows the arrangement of the second embodiment of the present invention.

Referring to FIG. 2, the pattern of IDTs 112 and 112' made of a conductive thin film is directly formed on the surface of a piezoelectric substrate 111, and a resistor thin film 113 is formed to cover the pattern of the IDTs 112 and 112' and the surface of the piezoelectric substrate 111. In this embodiment, the contact area of the resistor thin film 113 that constitutes the discharge line and the IDTs 112 and 112' can be increased.

The first and second embodiments may be combined. More specifically, another resistor thin film may be formed on the pattern of the IDTs 12 and 12' and the resistor thin film 13 of FIG. 1B.

As has been described above, according to the present invention, the piezoelectric substrate and the IDTs made of the conductive thin film are electrically connected to each other through the resistor thin film to constitute a discharge line for the charges from the piezoelectric substrate to the IDTs, so that the level of noise caused by the pyroelectric effect of the piezoelectric substrate and appearing at the input/output terminals of the SAW device can be suppressed and decreased.

What is claimed is:

1. A surface acoustic wave device comprising:

a piezoelectric substrate having a piezoelectric effect;

an interdigital electrode pattern made of a conductive thin film to perform conversion between an electrical signal and a surface acoustic wave; and a resistor thin film formed on said piezoelectric substrate between said piezoelectric substrate and said interdigital electrode pattern to electrically connect said piezoelectric substrate to said interdigital electrode pattern, said resistor thin film serving to remove charges due to a pyroelectric effect from a surface of said piezoelectric substrate to said interdigital electrode pattern and having minimum resistance such that the electrical performance of the surface acoustic wave device is not adversely affected.

2. A device according to claim 1, wherein said resistor thin film is formed on an entire surface of said piezoelectric substrate.

3. A device according to claim 1, wherein said resistor thin film comprises a silicon thin film.

* * * * *